United States Patent [19]

Kasukawa et al.

[11] Patent Number: 5,390,208
[45] Date of Patent: Feb. 14, 1995

[54] STRAINED QUANTUM WELL TYPE SEMICONDUCTOR LASER DEVICE

[75] Inventors: Akihiko Kasukawa; Toshio Kikuta, both of Tokyo, Japan

[73] Assignees: The Furukawa Electric Co., Ltd., Tokyo; Opto-Electronics Technology Research Co., Ltd., Yokohama, both of Japan; a part interest

[21] Appl. No.: 165,298

[22] Filed: Dec. 13, 1993

[30] Foreign Application Priority Data

Dec. 11, 1992 [JP] Japan ................................ 4-353406

[51] Int. Cl.$^6$ .............................................. H01S 3/18
[52] U.S. Cl. .................................................... 372/45
[58] Field of Search ....................... 372/43, 44, 45, 50, 372/46

[56] References Cited

U.S. PATENT DOCUMENTS

| | | | |
|---|---|---|---|
| 5,040,186 | 8/1991 | Logan et al. | 372/45 |
| 5,079,601 | 1/1992 | Isaki et al. | 372/43 |
| 5,155,738 | 10/1992 | Ijichi et al. | 372/46 |

OTHER PUBLICATIONS

Appl. Physics Lett., vol. 61, No. 21, Nov. 23, 1992, pp. 2506–2508 Y Imajo et al., "1.3μm In As$_y$P$_{1-y}$/InP strained layer . . . ".
Electronics Letters, vol. 28, No. 25, Dec. 3, 1992, pp. 2351–2352 Kasukawa et al, "Very low Threshold Current 1.3 μm . . . ".

Primary Examiner—Rodney B. Bovernick
Assistant Examiner—Robert McNutt
Attorney, Agent, or Firm—Jacobson, Price, Holman & Stern

[57] ABSTRACT

There is provided a strained quantum well layer semiconductor laser device that shows an improved temperature dependency of the threshold current and a high frequency performance while maintaining an excellent low threshold current operability. A strained quantum well layer type semiconductor laser device according to the invention comprises a light emitting active layer 14 of a multilayer structure including a quantum well layer 14a and a barrier layer 14c and a pair of light confining layers 13, 15, respectively laid on and under the active layer, the quantum well layer being made of InAs$_y$P$_{1-y}$ (0<y≦1), the barrier layer and/or the light confining layers being made of In$_{1-x}$Ga$_x$P (0<x≦1). Such a device shows an improved temperature dependency of the threshold current and a high frequency performance, while maintaining an excellent low threshold current operability because of the structural features of its active layer.

4 Claims, 3 Drawing Sheets

STRAINED QUANTUM WELL TYPE SEMICONDUCTOR LASER DEVICE

BACKGROUND OF THE INVENTION

1. Field of the Invention

This invention relates to an improvement in an semiconductor laser device having a strained quantum well structure.

2. Prior Art

FIG. 5 of the accompanying drawings illustrates a known strained quantum well type semiconductor laser device.

Referring to FIG. 5, the semiconductor laser device comprises an n-InP buffer layer 2 and a nondoped GaInAsP light confining layer 3 are sequentially laid on an n-InP substrate 1 and then a nondoped $InAs_yP_{1-y}$ strained quantum well layer 4a, a nondoped GaInAsP barrier layer 4b and a nondoped $InAs_yP_{1-y}$ quantum well layer 4c are sequentially laid thereon to form a light emitting active layer 4. Thereafter, a nondoped GaInAsP light confining layer 5, a p-InP clad layer 6 and a p+-GaInAs contact layer 7 are sequentially laid thereon to form a multilayer structure.

Of the layers, each of the light confining layer 3, the barrier layer 4b and the light confining layer 5 may be made of nondoped GaInAsP and have a wavelength specific to its composition which is equal to 1.1 μm, while the strained quantum well layer 4a may be made of nondoped $InAs_yP_{1-y}$ and have a film thickness of 80 Å, assuming its composition ratio y to be 0.55, and the semiconductor laser device may have a resonator length of 900 μm.

A strained quantum well type semiconductor laser device as illustrated in FIG. 5 and having the above specified values provides a low threshold current density of approximately 450 Å/cm².

As is well known, a well structure is formed for an energy band in a semiconductor laser device having an above described configuration, utilizing the compositional difference of the strained quantum well layer 4a, the light confining layers 3 and 5 and the barrier layer 4b.

If, for instance, the composition ratio y of the strained quantum well layer 4a comprising V-group elements is 0.55, a compression stress is applied to the strained quantum well layer 4a due to the difference of lattice constant to deform the layer by 1.77%.

In general, a strained quantum well layer of the type under consideration preferably has a large film thickness and/or a multilayer structure comprising a relatively large number of component layers from the viewpoint of reducing its oscillation threshold current level and raising its high frequency performance. However, a large film thickness and/or a multilayer structure of a strained quantum well layer can give rise to crystal dislocations if the strained quantum well layer is deformed to the above described extent.

It is known from experiments that a semiconductor laser device has a critical film thickness (total film thickness if it has a multilayer structure) of approximately 300Å.

Thus, the semiconductor laser device 4a may appropriately have a multilayer structure comprising two to three component layers from 300 Å (critical film thickness)/80 Å (thickness of each component film).

A conventional strained quantum well layer type semiconductor laser device typically shown in FIG. 5 may have a strained quantum well layer comprising only few component layers to raise the carrier density that each of the component layers of the strained quantum well layer bears, meaning that an enhanced carrier density is needed for oscillation.

This is why a conventional strained quantum well layer type semiconductor laser device is less effective than a nonstrained quantum well layer type semiconductor laser device in terms of oscillation threshold current, oscillation efficiency at high temperature range and high frequency performance.

In view of these technological problems, it is therefore an object of the present invention to provide an improved strained quantum well layer semiconductor laser device in terms of low threshold current, high temperature operation and high frequency performance.

SUMMARY OF THE INVENTION

According to the present invention, the above and other objects of the invention are achieved by providing a strained quantum well layer type semiconductor laser device comprising a light emitting active layer of a multilayer structure including a quantum well layer and a barrier layer and a pair of light confining layers, respectively laid on and under the active layer, characterized in that the quantum well layer is made of $InAs_yP_{1-y}$ ($0<y\leq1$) and the barrier layer and/or the light confining layers are made of $In_{1-x}Ga_xP$ ($0x\leq1$).

Preferably, the $InAs_yP_{1-y}$ strained quantum well layer satisfies inequality (1) below. Still preferably, the $In_{1-x}Ga_xP$ barrier layer and each of the $In_{1-x}Ga_xP$ light confining layers satisfies inequality (2) below.

$$|\epsilon_w \times L_w| < 45(\%\cdot nm) \quad (1)$$

where, $\epsilon_w$ is the strain, w is the ratio of deformation (%) and Lw is the thickness (nm) of each component layer of the strained quantum well layer.

$$|\epsilon_s \times L_s| < 45(\%\cdot nm) \quad (2)$$

where $\epsilon_s$ is the strain, s is the ratio of deformation (%) and Ls is the thickness (nm) of each component layer of the barrier layer and the light confining layers.

$InAs_yP_{1-y}$ ($0<y\leq1$) may have a value for compositional ratio y between 0.3 and 0.6 for the purpose of the invention.

A strained quantum well layer type semiconductor laser device according to the invention operate basically same as a comparable conventional semiconductor laser device.

When an electric current is introduced into the active layer and the intensity of the current exceeds the threshold for triggering laser oscillation or, differently stated, the gain exceeds the overall loss in the resonator, the spectral width of light is rapidly reduced to become a single line and consequently improve the quality of light (in terms of narrowed wavelength range and spatial uniformity).

Since a strained quantum well layer type semiconductor laser device according to the invention is subjected to compression strain for the quantum well layer and expansion strain for the barrier layer and/or light confining layers, the deformation of the quantum well layer is substantially offset by that of the barrier layer and/or light confining layers so that the net deformation of the former is considerably reduced.

As the quantum well layer is deformed only to an insignificant extent, no crystal dislocation may take place if the film thickness of the strained quantum well layer is raised and/or the number of component layers is increased. Consequently, it is possible to reduce the carrier density each component layer of the strained quantum well layer is required to bear, if the overall thickness of the strained quantum well layer and/or the number of component layers are increased.

Thus, a strained quantum well layer type semiconductor laser device according to the invention has a reduced oscillation threshold current level and can be made to show a good relationship between the oscillation threshold current and the temperature-dependent performance by reducing the carrier density level of the strained quantum well layer required for oscillation so that its light oscillation intensity may not be excessively responsive to temperature change and show an improved high frequency performance.

DETAILED DESCRIPTION OF THE PREFERRED EMBODIMENT

Figure 1:
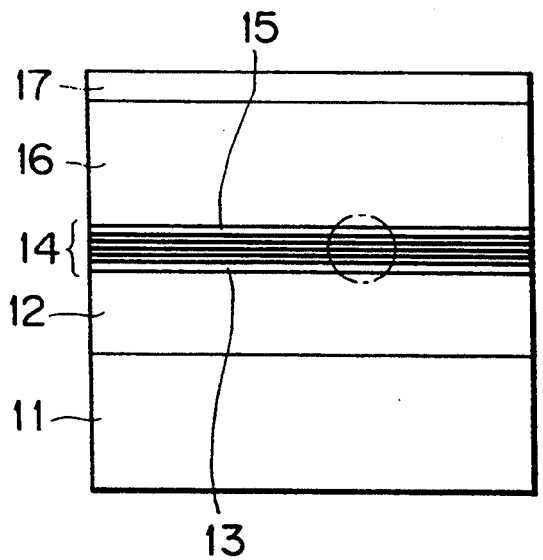
FIG. 1 is a schematic illustration of a preferred embodiment of semiconductor laser device according to the invention.
Figure 1A:
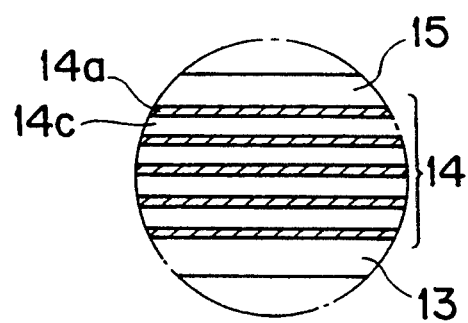

Now, the present invention will be described in greater detail by referring to the accompanying drawings, of which FIG. 1 illustrates a preferred embodiment of the invention.

Referring to FIG. 1, an n-InP buffer layer 12, a nondoped InGaAsP light confining layer 13, an active layer 14, a nondoped InGaAsP light confining layer 15, a p-InP clad layer 16 and a p+-GaInAs contact layer 17 are sequentially laid on an n-InP substrate 11 to form a multilayer structure, the active layer 14 being sandwiched between the two light confining layers 13, 15.

Each of the two light confining layers 13, 15 is made of nondoped InGaAsP having a composition specific wavelength of 1.1 μm.

Additionally, the semiconductor laser device is provided with a p-type metal electrode and an n-type metal electrode arranged, respectively on the bottom and top surfaces.

Figure 5:
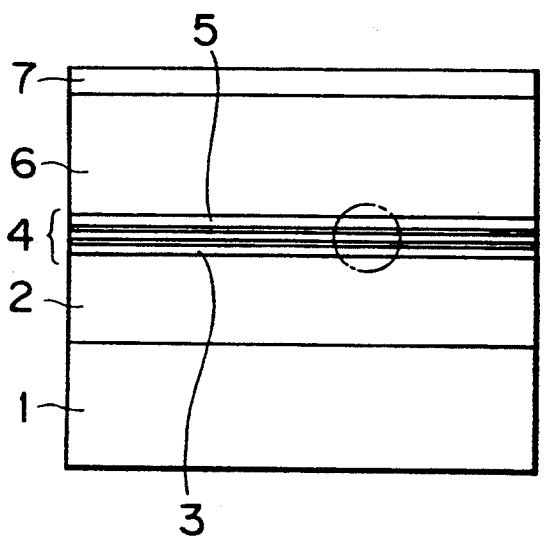
FIG. 5 is a schematic illustration of a conventional strained quantum well layer type semiconductor laser device.
Figure 5A:
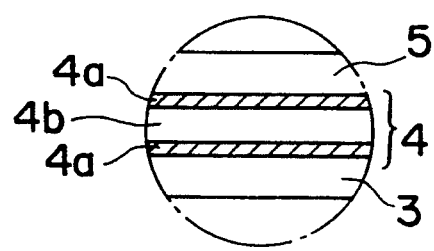

While, the multilayer structure of FIG. 1 is basically the same as that of a conventional device described above by referring to FIG. 5, it comprises an active layer 14 that differs from its counterpart of FIG. 5 in a manner as described below.

The active layer 14 of a device according to the invention comprises a nondoped $InAs_yP_{1-y}$ strained quantum well layer 14a having five component layers and a nondoped $In_{1-x}Ga_xP$ barrier layer 14c having four component layers, said component layers being alternately laid to form a multilayer structure.

The $InAs_yP_{1-y}$ ($0<y\leq 1$) strained quantum well layer 14a has a value for compositional ratio y between 0.3 and 0.6, whereas the $In_{1-x}Ga_xP$ ($0<x\leq 1$) barrier layer 14c has a value for compositional ratio x between 0.05 and 0.15.

More specifically, the compositional ratios y and x may be 0.55 and 0.1, respectively and each of the component layers of the strained quantum well layer 14a may have a thickness of 80 Å, whereas each of the component layers of the barrier layer 14c may be 100 Å thick.

For the purpose of comparison, if a quantum well layer made of $Ga_xIn_{1-x}As_yP_{1-y}$ and having a same ratio of deformation as that of the above defined strained quantum well layer is used for the purpose of the present invention, the thickness of the layer needs to be approximately as small as 30 Å, making it difficult to properly control the film thickness. In other words, a film thickness of 80 Å provides an advantage of an enhanced controllability of film thickness.

In order to quantify the effects of an active layer 14 as defined above for the purpose of the invention, an experiment was conducted in a manner as described below.

Semiconductor laser device specimens were prepared by forming above identified layers on an n-InP substrate 11 for each of them by means of a metal organic chemical vapor phase deposition growth technique (MOCVD growth method). A growth temperature of 550° C. and a growth pressure of 76 Torr were used for forming the component layers of the $InAs_yP_{1-y}$ ($0<y\leq 1$) strained quantum well layer 14a and those of the nondoped $In_{1-x}Ga_xP$ ($0<x\leq 1$) barrier layer 14c.

Trimethylindium (TMIn), triethylgallium (TEGa), hydrogen diluted 10% arsine ($AsH_3$) and hydrogen diluted 30% phosphine ($PH_3$) were used as growth materials. The crystals of the $InAs_yP_{1-y}$ (y=0.55) strained quantum well layer and the $Ga_xIn_{1-x}P$ (x=0.1) strained barrier layer could be made to grow by introducing TMIn and $PH_3$ at respective constant rates of 50 sccm and 340 sccm at 25° C. into them during the growth process. Otherwise, $AsH_3$ was introduced at a rate of 11 sccm into InAsP, whereas TEGa was introduced at a rate of 15 sccm at −5° C. into InGaP.

Each of the component layers of the strained quantum well layer 14a showed a film thickness of 80 Å and a ratio of deformation equal to 1.78% whereas each of the component layers of the barrier layer 14c proved to have a ratio of deformation equal to 0.7%.

Figure 2:
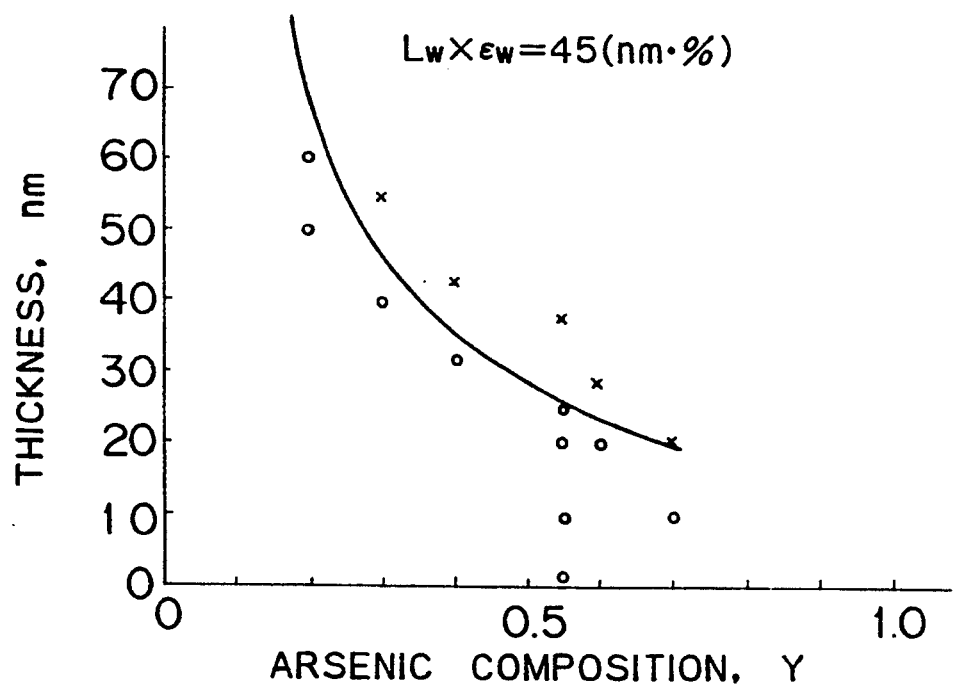
FIG. 2 is a graph showing the relationship between the As composition and the critical film thickness of the $InAs_yP_{1-y}$ ($0<y\leq 1$) strained quantum well layer obtained in an experiment conducted on specimens of semiconductor laser device according to the invention.
Figure 3:
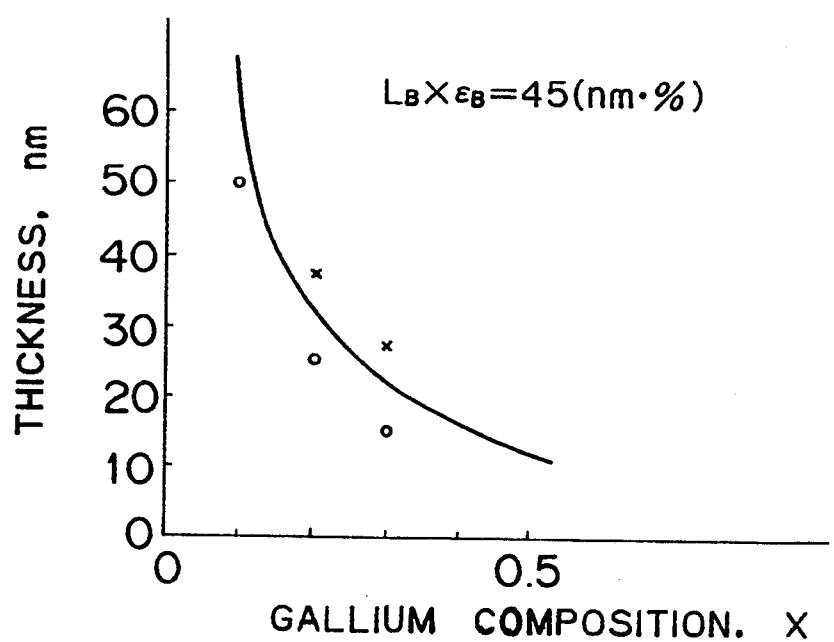
FIG. 3 is a graph showing the relationship between the Ga composition and the critical film thickness of the $In_{1-x}Ga_xP$ ($0<x\leq 1$) barrier layer obtained in the experiment of FIG. 2.

FIG. 2 illustrates the relationship between the As content ratio of crystal and the crystal film thickness obtained in an operation of checking, if crystal dislocations were observable conducted in the course of the experiment. FIG. 3 shows the relationship between the Ca content ratio of crystal and the crystal film thickness also obtained in another operation of seeing if crystal dislocations could be observed.

The graphs of FIGS. 2 and 3 were prepared as a result of the observations through a transmission electronic microscope. In the graphs o indicates "no crystal dislocation observed" and x indicates "crystal dislocation observed."

Figure 4:
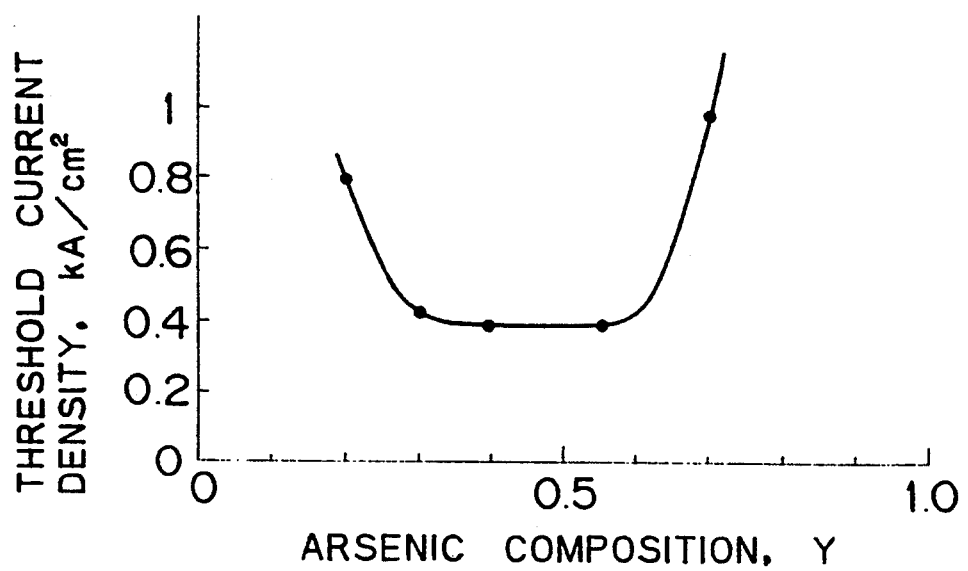
FIG. 4 is a graph showing the relationship between the As composition and the threshold current density of the $InAs_yP_{1-y}$ strained quantum well layer obtained in the experiment of FIG. 2.

FIG. 4 illustrates the relationship between the As content ratio and the threshold current density also obtained as a result of the experiment.

It is seen in FIG. 2 that, if y=0.55, no crystal dislocations were observed until the film thickness reached 25 nm and crystal dislocations became apparent when the film thickness went beyond 30 nm.

Likewise, taking x=0.1 in FIG. 3, it will be seen that no crystal dislocations were observed until the film thickness got to 50 nm.

Thus, by seeing both FIGS. 2 and 3 in combination, a conclusion can be drawn that no crystal dislocations take place, if either or both of the inequalities $|\epsilon_w \times L_w| < 45(\%\cdot nm)$ and $|\epsilon_s \times L_s| < 45(\%\cdot nm)$ are satisfied.

Additionally, by referring to FIG. 4, it will be seen that the threshold current density is low when y is found between 0.3 and 0.6.

Therefore, no crystal dislocations take place and the active layer operates effectively when either or both of the inequalities (1) and (2) are satisfied for the rate of deformation w and the thickness Lw of the active layer and y is found between 0.3 and 0.6 for its composition.

Incidentally, one of the above described specimens of the strained quantum well layer type semiconductor laser device (having a resonator length of 600 μm) showed a threshold current density of 410 Å/cm² when driven by laser.

Additionally, the temperature dependency of the threshold current or, differently stated, the sensitivity of the threshold current to temperature, of the specimens was as great as 75K at room temperature to show a great increase from 60K of comparable conventional devices when the threshold current was approximately 3 mA for both cases. This fact proves that a strained quantum well layer semiconductor laser device according to the invention stably operates against temperature changes.

As for the cutoff frequency, a significantly improved value of 10 GHz was obtained for a device according to the invention as compared with 4 GHz for conventional devices to evidence an improved high frequency performance, meaning that a device according to the invention can be effectively driven by laser at high temperature.

The above embodiment may be modified without departing from the scope of the present invention nor losing its effectiveness so long as the quantum well layer 14a is made of $InAs_yP_{1-y}$ ($0 < y \leq 1$) and the barrier layer 14c and the two light confining layers 13, 15 are made of $In_{1-x}Ga_xP$ ($0 < x \leq 1$).

Thus, a strained quantum well layer type semiconductor laser device according to the present invention shows an improved temperature dependency of the threshold current and a high frequency performance, while maintaining an excellent low threshold current operability because of the structural features of its active layer.

What is claimed is:

1. A strained quantum well layer type semiconductor laser device comprising a light emitting active layer of a multilayer structure including a quantum well layer and a barrier layer and a pair of light confining layers respectively laid on and under the active layer, characterized in that the quantum well layer is made of $InAs_yP_{1-y}$ ($0 < y \leq 1$) and the barrier layer and/or the light confining layers are made of $In_{1-x}Ga_xP$ ($0 < x \leq 1$).

2. A strained quantum well layer type semiconductor laser device according to claim 1, wherein the $InAs_yP_{1-y}$ strained quantum well layer satisfies inequality:

$$|\epsilon_w \times L_w| < 45(\%\cdot nm),$$

where w is the ratio of deformation (%) and Lw is the thickness (nm) of each component layer of the strained quantum well layer.

3. A strained quantum well layer type semiconductor laser device according to claim 1, wherein the $In_{1-x}Ga_xP$ barrier layer and each of the $In_{1-x}Ga_xP$ light confining layers satisfy inequality:

$$|\epsilon_s \times L_s| < 45(\%\cdot nm),$$

where s is the ratio of deformation (%) and Ls is the thickness (nm) of each component layer of the barrier layer and the light confining layers.

4. A strained quantum well layer type semiconductor laser device according to claim 1, wherein $InAs_yP_{1-y}$ ($0 < y \leq 1$) has a value for compositional ratio y between 0.3 and 0.6.

* * * * *